United States Patent [19]

Szluk et al.

[11] Patent Number: 4,703,551

[45] Date of Patent: Nov. 3, 1987

[54] PROCESS FOR FORMING LDD MOS/CMOS STRUCTURES

[75] Inventors: Nicholas J. Szluk; Gayle W. Miller, both of Fort Collins, Colo.

[73] Assignee: NCR Corporation, Dayton, Ohio

[21] Appl. No.: 822,075

[22] Filed: Jan. 24, 1986

[51] Int. Cl.[4] .......................................... H01L 21/265
[52] U.S. Cl. ...................................... 437/30; 432/57; 432/44
[58] Field of Search ................ 29/571, 576 W, 591; 357/23, 52, 47, 71; 148/1.5

[56] References Cited

U.S. PATENT DOCUMENTS

| | | | |
|---|---|---|---|
| 4,198,250 | 4/1980 | Jecmen | 148/1.5 |
| 4,356,623 | 11/1982 | Hunter | 29/576 B |
| 4,366,613 | 1/1983 | Ogura et al. | 29/571 |
| 4,420,870 | 12/1983 | Kimura | 29/571 |
| 4,503,601 | 3/1985 | Chiao | 29/571 |
| 4,512,073 | 4/1985 | Hsu | 29/571 |
| 4,519,126 | 5/1985 | Hsu | 29/571 |
| 4,528,744 | 7/1985 | Shibata | 29/571 |
| 4,536,944 | 8/1985 | Bracco et al. | 29/571 |
| 4,575,920 | 3/1986 | Tsunashima | 29/571 |
| 4,578,128 | 3/1986 | Mundt et al. | 29/571 |
| 4,590,663 | 5/1986 | Haken | 29/571 |
| 4,593,454 | 6/1986 | Baudrant et al. | 29/571 |
| 4,597,824 | 7/1986 | Shinada et al. | 156/643 |
| 4,599,118 | 7/1986 | Han et al. | 29/571 |
| 4,616,399 | 10/1986 | Ooka | 29/571 |
| 4,621,413 | 11/1986 | Lowe et al. | 29/571 |

FOREIGN PATENT DOCUMENTS

| | | |
|---|---|---|
| 201415 | 4/1983 | Japan .................................. 29/571 |
| 105277 | 6/1985 | Japan .................................. 29/571 |
| 60-134473 | 7/1985 | Japan . |
| 60-193371 | 10/1985 | Japan . |

OTHER PUBLICATIONS

Codella, "Submicron Igfet Device with Double Implanted Lightly Doped Drain/Source Structure", IBMTDB, vol. 26, No. 12, May 1984, pp. 6584–6586.

Tsang, "Fabrication of High-Performance LDDFET's with Oxide Sidewall Technology", IEEE Journal of Solid-State Circuits, vol. SC-17, No. 2, Apr. 82, pp. 220–226.

Primary Examiner—Brian E. Hearn
Assistant Examiner—Tom Thomas
Attorney, Agent, or Firm—J. T. Cavender; Casimer K. Salys

[57] ABSTRACT

A process for selectively forming NMOS/PMOS/CMOS integrated circuits and for selectively incorporating any or all of lightly doped drain-source (LDD) regions, sidewall gate oxide structures, and guard band regions.

7 Claims, 11 Drawing Figures

PROCESS FOR FORMING LDD MOS/CMOS STRUCTURES

BACKGROUND OF THE INVENTION

The present invention relates to a method for forming small geometry, very dense MOS/CMOS integrated circuits having lightly doped drain/source (LDD) structures and, more particularly, to NMOS and CMOS integrated circuits formed by a process which incorporates sidewall gate oxides and guard band implants in addition to lightly doped drain/source implants without the use of additional photolithographic masking steps.

One of the constant aims of the microelectronics industry has been to achieve ever small device and component dimensions and spacings to provide increased packing densities. However, as the technology has progressed through LSI and VLSI toward future technologies, it has become increasingly difficult to provide the ever smaller, more dense integrated circuit structures and the associated spacings and diffusion depths. Various problems associated with decreased feature size contribute to decreased yields which can offset the savings occasioned by increased packing density and circuit performance. Perhaps chief among these problems are the so-called short channel effects, which include hot carrier injection into the gate oxide and/or substrate, source-to-drain punch through, threshold voltage reduction with channel length and drain/source operating voltage, subthreshold leakage, and impact ionization. For example, in hot carrier injection, electrons are injected into the gate oxide by the high electric field created by the narrow channel region and adjacent the drain and, as a consequence, alter the threshold voltage of the device. In addition to the short channel effects, overlap between the gate electrode and the source and drain diffusions results in parasitic capacitance between the diffusion regions and the gate, known as Miller capacitance, which decrease the device operational speeds.

Another problem encountered in manufacturing small geometry MOS devices relates to electrical shorts between interconnecting conductors such as the electrical conductors contacting the self-aligned gate, source and drain. In the fabrication of silicon gate MOS devices, after forming the polysilicon gate structure and the self-aligned source-drain regions, a metal such as tungsten can be selectively deposited over the polysilicon gate and the source/drain regions to provide low resistance conductor lines. However, the metal deposited in this manner invariably covers the top and sides of the polysilicon gate and can short to the metal deposited over the adjacent source/drain regions. Shorting can also occur between other conductors such as polysilicon interconnect lines.

The above-mentioned hot electron carrier injection, low voltage breakdown and impact ionization problems are alleviated using lightly doped drain-source (LDD) regions. The LDD structure is comprised of a shallow, gate-aligned $n^-$ or $p^-$ region formed between the MOSFET channel and the respective $n^+$ or $p^+$ source and drain diffusions. This structure increases breakdown voltage and reduces impact ionization and hot electron emission by spreading the high electric field at the drain pinchoff region into the $n^-$ region.

One method of fabricating LDD structures involves the use of sidewall spacers in conjunction with etching techniques such as anisotrophic and reactive ion etching (RIE). Tsang et al., "Fabrication of High Performance LDDFET'S with Oxide Sidewall-Spacer Technology", *IEEE Transactions on Electron Devices*, Vol. Ed-29, No. 4, April, 1982, pp 590–596, teaches a method for forming an LDD NMOSFET. According to Tsang et al., after forming the polysilicon gate structure consisting of the gate oxide, the polysilicon gate and an oxide etch mask n-type ions are implanted to form the $n^-$ LDD regions A layer of chemical vapor deposited (CVD) silicon dioxide of a desired thickness is then conformally deposited and, using directional RIE, the planar portion of the CVD oxide is removed to leave the vertical oxide sidewall spacer on the polysilicon gate structure. The sidewall spacer is used as a mask during arsenic ion implantation of the $n^+$ source and drain regions.

The Tsang et al. process, however, would not appear to be suitable for selective deposition of refractory metals, in that the process used to remove the oxide mask and expose the gate electrode would inherently remove material regions of the sidewall oxide. The device would then be prone to the shorting problems discussed above.

Liu, U.S. Pat. No. 4,330,931 issued May 25, 1982, discloses a process for forming a self-aligned silicon gate NMOS FET having $n^-$ source and drain extensions. In this process, after forming a polysilicon gate having a nitride overhang mask, arsenic ions are implanted to form the $n^+$ source and drain. During the implant step, lightly doped source and drain extensions are also formed due to the blocking of some ions by the nitride overhands. The structure is then subjected to a high temperature oxidization step to grow a 100 nanometer thick oxide over the sides of the polysilicon gate and the substrate corresponding to the source and drain regions. The oxide thus formed over the $n^+$ source and drain regions is then damaged by argon ion implantation. During this oxide damaging step, the oxide over the $n^-$ source and drain extensions regions at the sidewalls of the gate is protected by the nitride overhang mask. The damaged oxide and the nitride mask are then removed and a tungsten layer is selectively deposited over the exposed $n^+$ source and drain regions and the gate.

The oxide damaging step of the Liu '931 process is not only an extra process step but also requires very careful control. Furthermore, any variation in undercutting the polysilicon may cause damage to the sidewall oxide during the argon ion bombardment step. The Liu '931 process also appears to be limited to forming a very thin, 100 nanometers thick, polysilicon gate sidewall oxide. Consequently, upon selective deposition of tungsten over the polysilicon gate and the source and drain areas, adjacent tungsten strips still may short due to tungsten bridging.

Jecmen, U.S. Pat. No. 4,198,250 issued Apr. 15, 1980, also used an overhang mask on the polycrystalline silicon gate electrode to effect the implanting of an LDD structure. In this case, the mask is silicon dioxide. The overhang mask is provided by wet chemical overetching of the supporting poly gate, then the $n^+$ source and drain regions are implanted. During implantation, the mask overhang absorbs a large percentage, but not all, of the incident implant species. As a consequence, the $n^+$ source and drain implant also forms shallow, lightly doped LDD regions beneath the mask overhang between the channel and the $n^+$ source and drain regions.

As mentioned, overlap between the gate electrode and the source and drain results in parasitic capacitance between the impurity region and the gate, known as Miller capacitance, which decreases high frequency response and operational speeds. Increased depth can also cause increased susceptibility to punch through. The Jecmen '250 patent states that its LDD regions do not diffuse (laterally or vertically) significantly during the subsequent high temperature processing. As a consequence, the LDD regions do not significantly overlap the gate and retain their shallow junction depth. The initial shallow aligned LDD regions and the subsequent dimensional stability provide reduced Miller capacitance.

As indicated by perusal of the above article and patents, the effectiveness of lightly doped source-drain structures and sidewall oxide structures in improving device performance and eliminating problems associated with small geometry high density integrated circuit structures is known. As is also evident from a reading of the above article and patents, in implementing these beneficial structures, it is difficult to avoid process complexity and to maintain device yields. It is accordingly, an object of the present invention to implement a lightly doped drain/source structure using a process of relative simplicity, which is conducive to high yields, and is amenable to the incorporation of other beneficial structures, described below.

In addition, it is an object of the present invention to provide a reproducible manufacturing process for forming a short channel graded source and drain doping profile for controlling hot carrier effects. It is also an object of the present invention to optionally incorporate sidewall oxide spacers into such process with a minimum of additional process steps for the purpose of eliminating shorting between the gate and the source/drain metal depositions.

Chiao, U.S. Pat. No. 4,503,601, issued Mar. 12, 1985, which is assigned to the assignee of the present application, is directed to a reproducible manufacturing process for forming NMOS devices which incorporate both LDD structures and sidewall oxide spacers. Initially, after forming the gate oxide, and forming a doped polysilicon layer, a silicon oxide layer, and a silicon nitride layer and patterning the poly-oxide-nitride into the configuration of the gate electrode, n− LDD regions are formed in self-alignment with the gate by ion implantation. Then, a low temperature selective oxidation process is applied to form a much thicker layer of oxide on the vertical sidewalls of the highly doped polysilicon gate than over the lightly doped exposed substrate. The thin source/drain oxide is then readily removed, leaving thick sidewall oxide spacers which self-align the n+ source and drain implants with the LDD regions and also prevent shorting of the gate to the source/drain diffusion during subsequent metallization It is another object of this invention to modify and extend the Chiao LDD/sidewall oxide structure to incorporate a guard band diffusion into the source and drain structures in combination with either or both the LDD structure or the sidewall oxide structure using a minimum of additional process steps, for the purpose of minimizing effects such as drain-induced barrier lowering and subthreshold leakage in addition to minimizing other, short channel effects and Miller capacitance.

It is yet another object of this invention to realize the above objectives in a process for forming complementary MOS structures.

SUMMARY OF THE INVENTION

The present invention is an improvement of and an extension of the above Chiao '601 in that it uses a different process sequence to provide lightly doped drain/source regions alone or in combination with guard band regions and/or sidewall oxide spacers in a CMOS integrated structure. In the following detailed summary of the process sequence, the various steps are indicated by numerals to aid subsequent reference.

In one aspect, the present process is a process for forming a complementary set of PMOS and NMOS integrated circuit devices incorporating LDD, guard band and oxide sidewall structures and comprises: (1) forming a gate structure for the PMOS and NMOS devices having an overlying overhang mask defining underlying regions adjacent the gate structure as source and drain regions. In step (2), the structure is placed in an oxidizing ambient at a relatively low temperature to preferentially form a relatively thick sidewall oxide on the highly doped NMOS and PMOS gate structures. Next, (3), the NMOS n+ source and drain are implanted in self-alignment with the overhang mask or with the overhang mask and sidewall oxide. In step (4), the thickness of the NMOS sidewall oxide is selectively partially etched, leaving a remnant thickness for the purpose of providing insulation between the gate and source/drain connections. Next, (5), the overhang mask is removed and (6) n-type ions are selectively implanted in the NMOS active area at a relatively low energy and dose to form LDD regions in self-alignment with the NMOS gate between the gate and the n+ regions. Step (7) involves selectively implanting p-type species at relatively high energy and dose to a relatively deep junction depth in self-alignment with the PMOS overhang mask. Step (8) involves selectively partially etching the thickness of the PMOS sidewall oxide leaving a remnant insulating thickness at the sidewall followed by (9) removal of the PMOS overhang mask. In step (10), a PMOS guard band diffusion is formed about the associated LDD region by selectively implanting (in the PMOS active area) n-type species to a relatively shallow junction depth in self-alignment with the PMOS gate and between that gate and the p+ source and drain regions. Finally, (11) the CMOS structure in blanket implanted with p-type species to simultaneously provide the guard band diffusion about the NMOS LDD region and form the PMOS LDD diffusion in the associated diffusion region.

As indicated above, the present process is believed to provide a unique combination of lightly doped drain-source, sidewall oxidation and guard band structures in a relatively straightforward reproducible manufacturing process.

In fact, the combined LDD, sidewall oxide and guard band structures are provided in a CMOS fabrication sequence which requires only two more processing masks than the Chiao NMOS process, i.e., the same additional number necessary for conventional CMOS integrated circuits. The two additional masks are, first, for the PMOS active region during the NMOS source/drain processing, and, second, for the NMOS active region during the PMOS source/drain processing.

Furthermore, the described process is readily tailored to delete the above individual features in response to the needs of a particular circuit. This permits tailoring the process to the lowest possible level of complexity consistent with the density and operational requirements of the circuit. In short, where one or more of the features is/is not needed it is readily included/deleted from the process fabrication sequence.

As an example, the sidewall oxide can be eliminated by deleting steps (2), (4) and (8). The guard bands are eliminated by deleting step (10) and by using step (11) to provide only the LDD diffusion.

Also, the PMOS (NMOS) sequence can be deleted to provide an NMOS-only (PMOS-only) process.

BRIEF DESCRIPTION OF THE DRAWINGS

These and other aspects of the present invention are described in greater detail in conjunction with the appended drawings, in which.

DETAILED DESCRIPTION OF THE PREFERRED EMBODIMENTS

Figure 1:
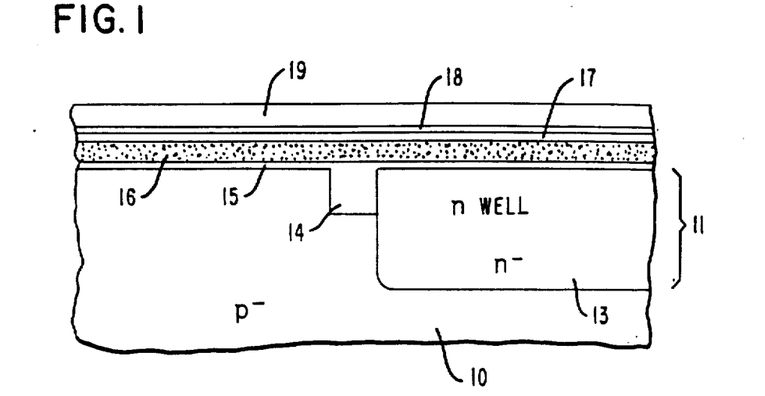
FIGS. 1-11 are schematic cross-sectional representations of CMOS FETs taken sequentially during the major processing steps and illustrating the sequence for forming LDD structures, sidewall spacers and guard band structures in the complementary integrated circuit.

Referring to FIG. 1, the starting structure for the present invention typically is an unpatterned bulk <100> silicon substrate or, preferably, a p⁻ type epitaxial layer 10, formed on a substrate, which layer has a resistivity of about 8 to 20 ohm centimeters. The epitaxial layer will then be processed to form n⁻ well regions 13.

To reach the stage of fabrication depicted in FIG. 1, a trench dielectric isolation structure 14 is formed to a typical thickness of about 1 to 2 micrometers and a typical depth of 1 to 5 micrometers to define and electrically isolate the active areas of the CMOS p-channel and n-channel devices. The trench structure 14 can be formed by following the technique disclosed in U.S. Pat. No. 4,104,086.

Next the n-wells 13 are formed in the epitaxial layer. An implantation mask (not shown) is formed to define or expose the n-wells using conventional ultraviolet photolithographic techniques. The n-well 13 is then formed by depositing impurities in the exposed substrate epitaxial layer in the presence of the mask. Preferably, this is done using ion implantation, although furnace diffusion can be used. A typical ion implantation sequence for forming the n⁻ phosphorous well 13 in the p⁻ layer 10 involves ion implantation of phosphorous at about 125 keV and a dose of about 2.5E12 cm⁻². Other n-type impurities such as arsenic and antimony can be used. As the result of this processing, electrically isolated p⁻ regions 10 and n⁻ wells 13 are defined for the NMOS and PMOS transistors, respectively.

Next, a high quality silicon dioxide layer 15 is formed over the substrate to serve as the gate insulator of the CMOS transistors. Typically, the gate oxide layer 15 is formed about 20 to 50 nanometers thick. One suitable process is thermal oxidation in an oxidizing ambient at between 900° to 1100° C. An excellent quality oxide, although a slower-growing one, is provided by oxidation of the substrate using an HCl/O$_2$ ambient at a temperature of between about 900° to 1000° C.

Referring still further to FIG. 1, a highly doped polycrystalline silicon (poly) layer 16 is next formed to a thickness of about 200 to 500 nanometers on the gate oxide layer 15. The doping level of about $10^{20}$ to $10^{21}$ atoms/cc provides the high conductivity necessary for the electrode and other conductors which are formed from the layer 16 and also aids the formation of a thick oxide sidewall on the gate electrode by preferential oxidation in the event such a step is used. Low pressure chemical vapor deposition (LPCVD) is one suitable process for forming the poly gate layer 16 using SiH$_4$ ambient. The poly can be doped in situ by adding the impurity species to the gas ambient system, or afterwards. One example of a separate doping step uses phosphorus oxychloride (POCl$_3$) doping at a temperature of about 925° to 975° C. for a time of one hour to attain the impurity concentration noted above.

The next step is to form the oxide 17 and nitride 18, the composite overhang-mask layers. The PAD oxide layer 17 is formed to a thickness of about 10 to 30 nanometers using thermal oxidation in an oxidizing ambient such as steam at 950° to 1150° C. to convert the upper surface of the poly layer 16 to silicon dioxide. Another suitable approach is chemical vapor deposition. The silicon oxide layer 17 reduces the stress between the polysilicon layer 16 and the subsequently formed silicon nitride layer 18. Oxide layer 17 also facilitates the removal of nitride layer 18 at a later stage in the fabrication cycle. The oxide also is used as an oxidation/dopant mask in conjunction with the silicon nitride layer 18. The silicon nitride layer is formed on the oxide to a thickness of about 100 to 300 nanometers by conventional processing such as LPCVD using a silane and ammonia gas ambient (SIH$_4$/NH$_3$) and a typical reaction temperature of about 800° C. As mentioned, the silicon nitride layer 18 provides a barrier to doping and oxidation of the underlying structure during subsequent processing. The primary masking use of the silicon nitride is in the formation of the LDD source and drain regions.

Figure 2:
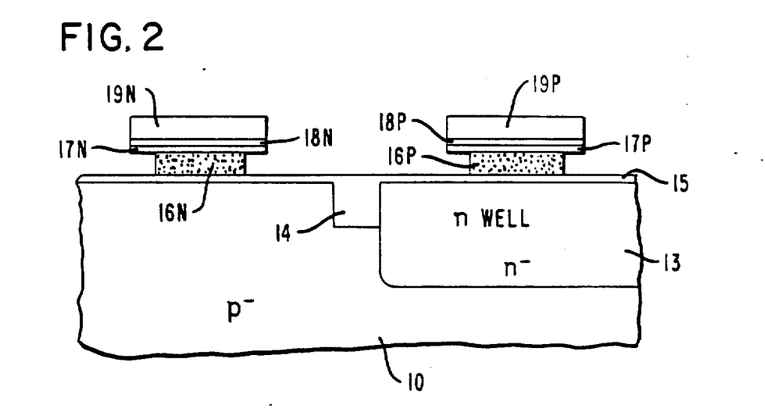

Referring to FIGS. 1 and 2, the silicon nitride 18 and silicon dioxide 17 layers are then patterned into an overhang masking structure and the polysilicon layer 16 is formed into gate electrodes which are recessed beneath the oxide-nitride mask. The oxide 17 and nitride 18 can be patterned using conventional photolithographic and etching techniques. These include the above-mentioned ultraviolet photolithographic technique involving the application of a photoresist layer 19 (FIG. 1) about 500 to 1,000 nanometers thick, followed by exposure of the layer to ultraviolet radiation in the presence of a mask, and developing and dissolving of selected areas to leave the gate overhang mask 19N and 19P (the N and P suffixes indicating whether the element relates respectively to the n-channel or p-channel FET) shown in FIG. 2. The nitride layer 18 is then etched into masks 18N and 18P, using the overlying photoresist masks 19N and 19P as an etch mask, by conventional etching techniques such as RIE etching. Similarly, the oxide masking sections 17N and 17P are then formed, for example, by reactive ion etching using the overlying photoresist-nitride dual layer as an etch mask. The polysilicon layer 16 is then patterned using an isotropic etch to form the NMOS and PMOS gate electrodes 16N and 16P recessed about 100 nanometers from the edge of the composite oxide nitride masks. The photoresist masks 19N and 19P can be removed either before or after the polysilicon gate electrode etch. One suitable polysilicon etching approach which has the desired lateral etch component is plasma etching using SF$_6$ etching gas.

Figure 3:
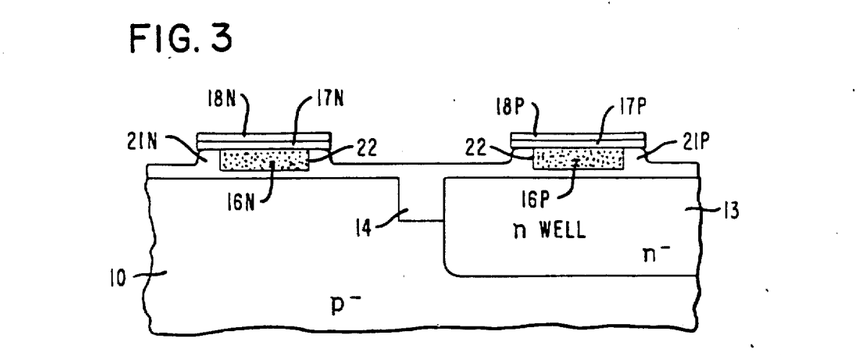

The next step shown in FIG. 3 is to form thick oxide sidewall layers 21N and 21P on the vertical sidewalls 22N and 22P of the polysilicon gates 16N and 16P. The sidewall oxide 21N and 21P are used to prevent shorting of the gate and source/drain metallization in the LDD integrated circuit structure. Additionally, the sidewall oxides can be used as a mask during the formation of the LDD source/drain regions. The sidewall oxides are formed by a preferential, blanket steam oxidation of the existing integrated circuit structure. The sidewall oxide growth is preferential in the sense that the growth rate and, therefore, the resulting oxide thicknesses are significantly greater at sidewalls 22N and 22P than that over the substrate source/drain regions or other lightly doped or undoped regions of polycrystalline or monocrystalline silicon. The growth and thickness rations of the sidewall oxides relative to the oxide growth of the source/drain substrate regions is a function of factors such as the crystallographic orientation of the silicon substrate (the growth rate for <111> silicon is aoout 10 to 20% higher than for <100>); the relative doping concentrations of the polycrystalline silicon gate and the silicon substrate ($10^{20}$–$10^{21}$ atoms per cubic centimeter polysilicon provides an oxide thickness of about 6 to 10 times that of undoped <100> silicon); oxidation temperature (the highly doped/lightly doped growth rate ratio increases as the oxidation temperature is lowered), and the oxidation pressure (oxidation rates increase with increasing pressure and, generally, increase faster for highly doped silicon than for lightly or undoped silicon). Because of these factors and the enhancing effect of low temperature on the growth rate ratio, in one preferred embodiment of the present polysilicon sidewall oxidation technique (using <100> silicon substrate p-region 10 and n-wells 13, a polysilicon gate phosphorus dopant concentration of about $10^{20}$–$10^{21}$ atoms per cubic centimeter, and p-region 10 and n-well 13 arsenic surface concentrations of about $10^{16}$–$10^{18}$ atoms per cubic centimeter), the thicknesses of the polysilicon sidewall oxides 21N and 21P and the oxide layer formed over thin oxide layer 15 will be approximately 440 nanometers and 70 nanometers, respectively, when the substrate is subjected to an oxidation step at ambient pressure and temperature of about 750° C. for a period of three hours. The thickness of the polysilicon sidewall oxide regions 21N and 21P is approximately six times that of the substrate oxide. The total thickness of the thermal substrate oxide and existing gate oxide 15 was 120 nanometers. The resulting structure is shown in FIG. 3.

Figure 4:
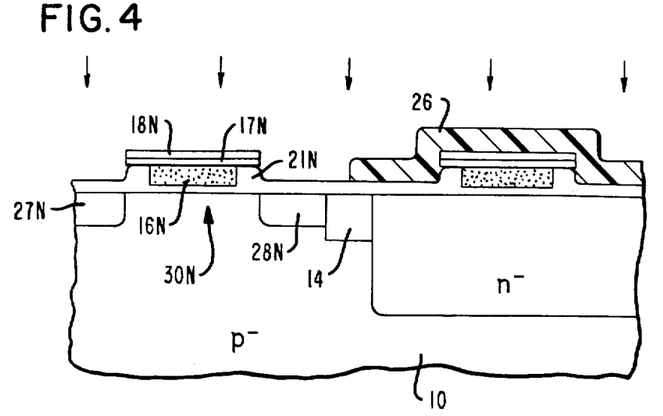

Next, referring to FIG. 4, a mask 26 is formed over the PMOS active regions using conventional photoresist and photolithographic forming techniques and the heavily doped n+ source and drain regions 27N and 28N for the NMOS device are implanted. Arsenic is a preferred dopant, because the relatively heavy mass and relatively small diffusion coefficient of arsenic makes it relatively immobile and forms a shallow junction. One typical example of this step, for forming arsenic-doped source and drain regions 27N and 28N of concentration $10^{20}$ atoms/cc involves an implant of 5E15–5E16 cm$^{-2}$ at an energy of 80 keV. During implantation, the oxide 17N-nitride 18N composite masking structure masks the underlying channel 30N and LDD regions so that the heavily doped n regions 27 and 28 are formed spaced away from the channel region adjacent to the LDD region.

Figure 5:
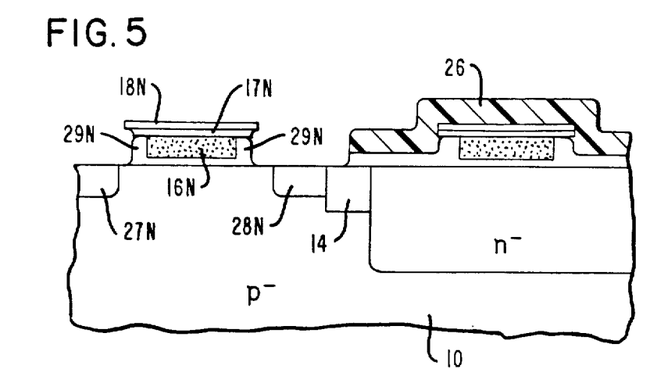

Referring to FIG. 5, next the sidewall oxide regions 21N are isotropically etched to partially reduce the thickness thereof. A typical process involves a 30:1 HF dip for 30 seconds. The purpose is to decrease the original thickness of the sidewall oxide 21N from about 440 nanometers to about 150 nanometers, to provide adequate electrical separation for the subsequently formed gate and source/drain metallization, and provide a dopant mask for the LDD regions which nonetheless permits light doping thereof. The resulting reduced thickness sidewall oxide regions 29N are shown in FIG. 5.

Figure 6:
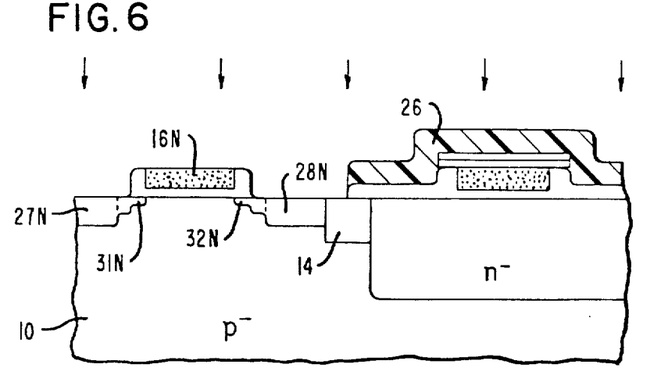

Following sidewall reduction, and referring to FIG. 6, the nitride cap 18N and oxide pad 17N are removed by conventional techniques such as a plasma etch, or a nitride etch using concentrated hot phosphoric acid at about 160° C. followed by oxide removal in buffered hydrofluoric acid. During this removal sequence, the NMOS sidewall oxixe 29N will also be etched. However, as the residual sidewall oxide thickness is relatively large, the relatively small additional thickness removed does not alter the above characteristics of electric isolation and dopant mask. The etch process also removes the substrate surface oxide 15 outside the PMOS mask 26.

With the composite oxide-nitride mask removed as shown in FIG. 6, the structure is subjected to a light dopant step using n-type ions such as arsenic to deposit the shallow, lightly doped n$^-$ source and drain regions 31N and 32N, respectively.

Typical arsenic ion dose and energy for forming the n$^-$ regions are 1E13–1E14 cm$^{-2}$ and 160 keV, respectively. The resulting lightly doped source and drain regions 31N and 32N have a very shallow junction depth of about 100–150 nanometers, are self-aligned with the gate electrode 16N and are in electrical contact with the deep n+ source and drain contact regions 27N and 28N.

Subsequently, the mask 26 is removed. The next step, optional for CMOS, involves a thermal anneal in an inert ambient such as nitrogen or argon to drive in the n+ source-drain regions 27N and 28N. An anneal at 900° C. for one hour results in n+ junction depths of about 200 to 400 nanometers. The lightly doped arsenic regions 31N and 32N have excellent dimensional thermal stability; their junction depth and lateral dimensions are not changed significantly by the n+ anneal.

Figure 10:
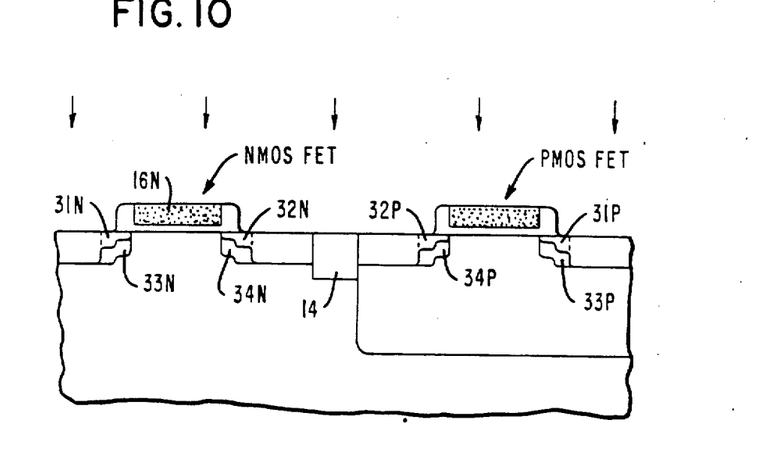

The above sequence supstantially completes the crucial NMOS process steps except for the formation of the p-type guard bands 33N and 34N, FIG. 10. In the event PMOS devices are not formed, a light p-type boron guard band implant can be made at this point to complete the critical NMOS-only fabrication steps. Preferably, for CMOS processes, these guard bands are formed subsequently during the PMOS LDD formation to save a dopant step.

As stated previously, the nitride-oxide composite masking structure is a sufficient mask for the n+ source-drain doping step (and the subsequent p+ source-drain doping step). Therefore, the sidewall oxide spacers can be eliminated for the NMOS and/or the PMOS device in the event they are not required for isolation between the gate and source/drain conductors. When the sidewall oxide spacers are present, however, they can be used to reduce the thickness of the oxide 17-nitride 18 mask or of the nitride-only mask.

Figure 7:
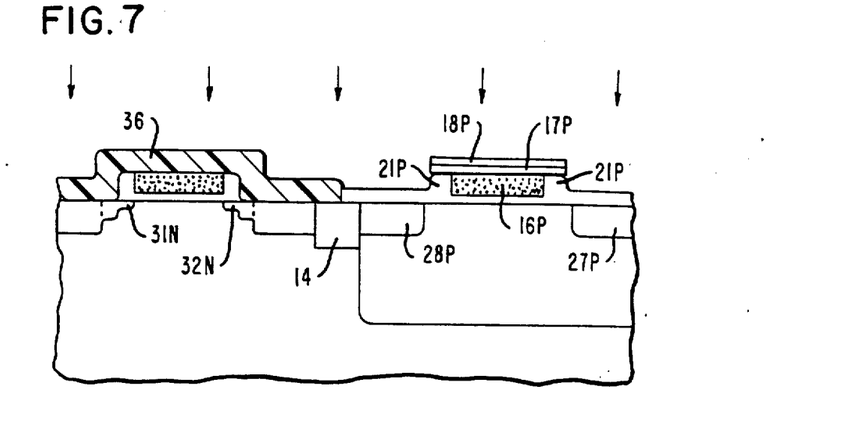

The separate PMOS processing starts at FIG. 7 and is similar to the NMOS process. Initially, a mask 36 is formed over the NMOS active regions. To accomplish this, a photoresist layer may be formed and conventional photolithographic techniques used to pattern the mask. The deep p+ source and drain regions 27P and 28P are then formed using boron or other p-type dopant species. A typical boron implant sequence involves a dose of 2E15–1E16 cm$^{-2}$ and an energy of 20 keV to form a concentration of 2E10$^{20}$ atoms/cc.

Figure 8:
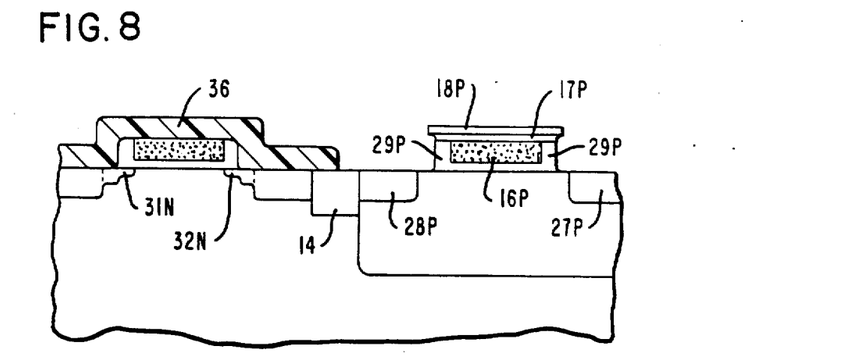

Referring to FIG. 8, the lateral thickness of the PMOS gate sidewall oxide spacers 21P are then reduced using the same etching process which was described relative to the NMOS device, FIG. 5, and with substantially identical results. The oxide 17P-nitride 18P composite mask is then removed as described relative to the NMOS device, FIG. 5 See FIG. 9.

Figure 9:
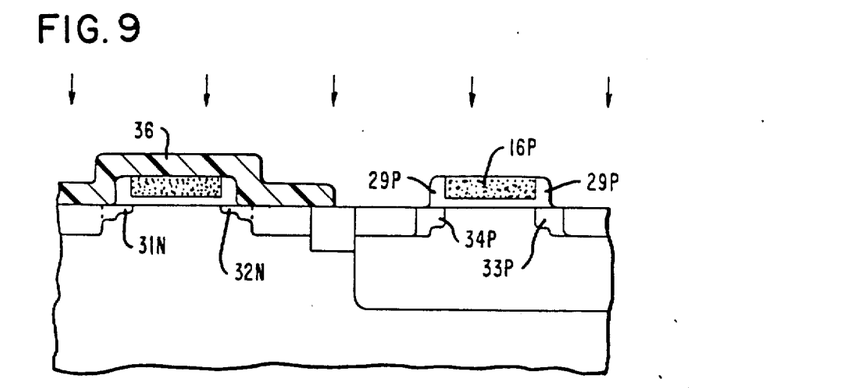

Referring further to FIG. 9, shallow, relatively heavy doped n+ guard band regions 33P and 34P are then formed in the PMOS active region, selfaligned with the gate 16P. Note, the sidewall oxide spacers 29P absorb some of the incident ions, but the dose/energy and implant angle is readily adjusted to compensate for this. This absorption/compensation applied to the other LDD and guard band doping steps as well. Preferably, a relatively heavy, immobile n-type dopant species such as phosphorous is used to provide a shallow junction depth, minimum overlap of the guard bands 33P, 34P with the gate, and minimum lateral and vertical diffusion during the subsequent thermal processing. A typical phosphoros guard band implant sequence involves a dose of 8E12 cm$^{-2}$ and an energy of 120 keV.

Referring now to FIG. 10, after the PMOS guard band formation, the NMOS mask 36 is removed and the integrated circuit structure is given a shallow blanket p-type implant to simultaneously form the PMOS LDD regions 31P and 32P along with the NMOS guard band regions 33N and 34N. A suitable boron implant process for this step involves a boron dose of 5E13 cm$^{-2}$ and implant energy of 20 keV. The implant (and the subsequent diffusion of the mobile boron atoms compared to the relatively immobile n-type atoms) forms the NMOS guard bands 33N and 34N at a junction depth of about 200 nanometers, just slightly deeper than the 150 nanometer junction depth of the associated LDD regions 31N and 32N. This implant simultaneously forms the PMOS LDD regions 31P and 32P to a junction depth of about 200 nanometers which is slightly shallower than the 250 nanometer junction depth of the associated guard band regions 33P and 34P. The representations of the LDD and guard band regions as depicted in the drawings have been exaggerated to accentuate the structural effects.

The CMOS structure is annealed as described previously in an inert ambient such as nitrogen or argon to drive in the heavily doped p+ and n+ regions to the final junction depths of about 200 nanometers for the NMOS source and drain and about 350 nanometers for the PMOS source and drain. The LDD short channel regions and the guard band regions are substantially unaffected by this anneal, because these lightly doped regions do not diffuse substantially at the annealing temperatures used.

Figure 11:
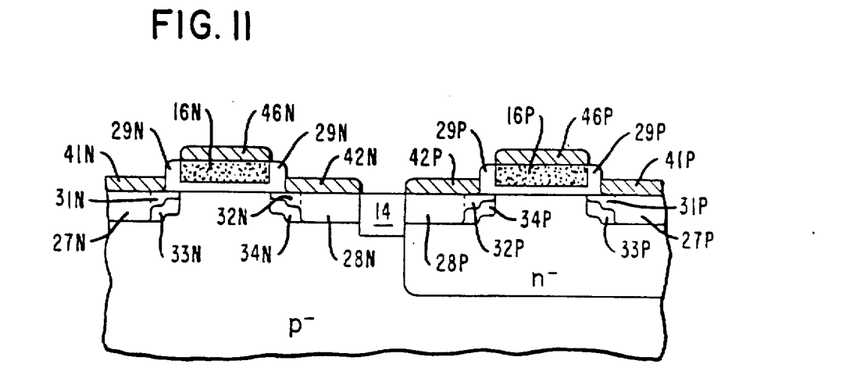

Next, referring to FIG. 11, a metal such as tungsten is selectively deposited to a thickness of about 100 to 200 nanometers, for example, using chemical vapor deposition and gaseous tungsten hexafluoride (WF$_6$), over all the exposed areas of the silicon substrate and the polysilicon gates 16N and 16P. During this selective deposition step, no tungsten is formed over the oxide regions such as sidewalls 29N and 29P. The tungsten conducting members 41N, 41P, 42N, 42P, 46N and 46P formed in this manner make electrical contact, respectively, with the source and drain regions 27N, 27P, 28N and 28P and polysilicon gate electrodes 16N and 16P. Other metals that are suitable for substitution for tungsten include refractory metal silicides such as tungsten silicide.

The described process for forming short channel NMOS and PMOS IC structures is very well suited for use with the vertical sidewall trench isolation technique described in copending U.S. patent application having Ser. No. 06/667,181, filed on Nov. 1, 1984, which application is assigned in common with the present application.

The disclosed process of the present invention provides NMOS and CMOS devices having polysilicon gates and interconnects which are 1–5 micrometers or less in width and having source and drain regions which are 1–3 micrometers or less on a side. The use of gate sidewall oxide spacers prevents short-circuiting between adjacent conductors such as those formed on the gate electrodes and source/drain regions. The minimum spacing between such conductors is determined by photolithographic limitations. Using the disclosed process in conjunction with conventional optical lithography, it is possible to use a conductor spacing of one micrometer. The use of x-ray lithography or other more precise lithography will reduce the interconductor or interconnect spacing to much less than 1 micrometer.

The present process also creates shallow diffusions of the same type as the source/drain diffusions, but which are more lightly doped. The shallow LDD diffusions are less subject to redistribution upon anheal and are therefore very closely aligned to the edge of the polysilicon gates and, as a consequence, reduce Miller capacitance and allow faster device operation compared to conventional CMOS processing. The deeper, highly doped source/drain regions 27 and 28 are provided by the process at a distance far enough away from the gate to allow the shallow diffused LDD regions 31N, 32N, 32P and 33P to determine critical device characteristics, yet still provide low resistance connections. In addition, the process provides shallow guard bands 33N, 34N, 33P and 34P of doped silicon at the junction edges of the LDD diffusion regions. These guard bands are of the opposite conductivity type as the source/drain diffusions. The guard bands are the same conductivity type as the corresponding bulk substrate, epi layer or well regions. The guard bands are more highly doped than are the bulk regions, however, and yield the advantages of using a more highly doped bulk region without increasing the back-gate effect or junction capacitance.

Furthermore, the overall process is designed so that in the event any of the above features is not critical to a particular integrated circuit, it can be deleted. Because of the control which is provided over the degrading effects normally associated with small dimension devices, and because of the associated processing simplicity, which is similar to that of conventional CMOS processes, the present process is amenable to the high yield manufacture of high-quality, short channel integrated circuit devices.

Having thus described preferred and alternative approaches to the present invention, what is claimed is:

1. A process for forming an NMOS integrated circuit structure incorporating lightly doped drain/source structure, drain/source guard bands and oxide sidewall structures, comprising: forming a gate structure for the NMOS device having an overlying overhang mask defining underlying regions adjacent the gate structure as source and drain; preferentially forming a sidewall oxide layer from the highly doped NMOS gate structure at a relatively low temperature and to a correspondence with the overhang mask; subjecting the structure to an n-type implantation in the presence of the overhang mask to form relatively heavily doped n-type source and drain regions in self-alignment with the overhang mask; etching the sidewall oxide layer ot reduce the thickness thereof; removing the overhang mask; implanting n-type ions in the MNOS active area to from a relatively shallow lightly doped regions in self-alignment with the NMOS gate between the gate and the n+ source and drain regions; and implanting p-type ions at an intermediate dose to form p-type guard band regions at the NMOS lightly doped drain-source regions.

2. A process for forming a PMOS integrated circuit structure incorporating lightly doped drain/source structure, drain/source guard bands and oxide sidewall structures, comprising: forming a gate structure for the PMOS device having an overlying overhang mask defining underlying region adjacent the gate structure as source and drain regions; preferentially forming a sidewall oxide layer from the PMOS gate structures at a relatively low temperature and to a correspondence with the overhang mask; subjecting the structure to a p-type ion implantation in the presence of the overhang mask to form relatively heavily doped p-type sourve and drain regions in self-alignment with the overhang mask; etching the sidewall oxide layer to reduce the thickness thereof; removing the overhang mask; implanting n-type ions at a relatively light dose to form a n-type guard band regions in self-alignment with the PMOS gate between the gate and the p+ source and drain regions and about the associated regions where lightly doped drain-source regions are formed; and implanting the structure with p-type species at a selected energy and doe to form lightly doped p-type drain-source diffusions in said accociated regions.

3. A process for forming a complementary PMOS and NMOS integrated circuit structure incorporating lightly doped drain and source (LDD) structures, and comprising: forming a gate sturcture for each device having an overlying overhang mask defining underlying regions adjacent the gate structure as source and drain regions; preferentially forming sidewall oxide layers to a correspondence with the overhang masks; doping the NMOS source and drain regions with n-type dopant in the presence of the NMOS overhang mask to form the heavily doped n-type source and drain regions in self-alignment with the NMOS overhang mask; selectively narrowing the thickness of the NMOS sidewall oxide layer; removing the NMOS overhang mask; relatively lightly doping the NMOS active areas adjacent the gate structure with n-type dopant to form LDD regions in self-alignment with the NMOS gate between the gate and highly doped source and drain regions; selectively doping the PMOS source and drain regions with p-type dopant in the presence of the PMOS overhang mask to form the heavily oped p-type source and drain regions in self-alignment with the PMOS overhang mask; selectively narrowing the thickness of the PMOS sidewall oxide layer; removing the PMOS overhang mask; and relatively lightly doping the PMOS active areas adjacent the gate structure with p-type dopant to form LDD structure in self-alignment with the PMOS gate between the gate and the lighly doped source and drain regions.

4. The process of claim 3 wherein after removal of the PMOS overhang mask, the structure is selectively doped with n-type impurities to form guard band region for the PMOS LDD structures.

5. The process of claim 4 wherein the PMOS LDD doping step is a blanket doping step for simultaneously forming (a) p-type guard bands for the NMOS LDD structures and (b) the p-type LDD structures for the PMOS structures.

6. A process for forming a complementary PMOS and NMOS integrated circuit structure incorporting LDD structures, guard band structures and oxide sidewall structures, comprising: (1) forming a gate structure for the PMOS and NMOS devices having an overlying overhang mask defining underlying regions adjacent the gate structure as source and drain regions; (2) subjecting the structure to an oxidizing ambient at a relatively low temperature to preferentially form a sidewall oxide layer on the NMOS and PMOS gate structure to a correspondence with the overhang masks; (3) selectively implanting the NMOS source and drain regions to a relatively heavy n+ concentration in self-alignment with the NMOS overhang mask; (4) selectively and partially etching the NMOS sidewall oxide to reduce the thickness thereof to thereby provide a predetermined thickness of insulation between the NMOS gate and the associated heavily doped source and drain regions; (5) removing the overhang mask; (6) selectively implanting n-type dopant into the NMOS active area using a relatively low dose to form n-type LDD regions in self-alignment with the NMOS gate between the gate and the heavily doped NMOS source and drain regions; (7) selectively implanting the PMOS source and drain regions to a relatively heavy p+ doping concentration in self-alignment with the PMOS overhang mask; (8) selectively and partially etching the thickness of the PMOS sidewall oxide to reduce the thickness thereof and thereby provide a predetermined thickness of insulation between the PMOS gate and the associated heavily doped source and drain regions; (9) removing the PMOS overhang mask; (10) selectively implanting n-type dopant using a relatively low dose to form n-type guard band regions associated PMOS LDD regions in self-alignment with the PMOS gate and between the gate and the heavily doped PMOS source and drain regions; and (11) blanket implanting the CMOS structure with p-type dopant using a relatively low dose to simultaneously form guard bands about the NMOS n-type LDD structures and to form p-type LDD structure in said PMOS LDD regions.

7. A process for forming a complementary PMOS and NMOS integrated circuit structure incorporating LDD structures, guard band structures and oxide sidewall structures, comprising: (1) forming a gate structure for the PMOS and NMOS devices having an overlying overhang mask defining underlying regions adjacent the gate structure as source and drain regions; (2) subjecting the structure to an oxidizing ambient at a relatively low temperature to preferentially form a relatively thick sidewall oxide on the highly doped NMOS and PMOS gate structures to a correspondence with the overhang masks; (3) masking the PMOS device active area; (4) implanting the NMOS source and drain regions to a relatively heavy n+ concentration in self-alignment with the NMOS overhang mask; (5) selectively etching the NMOS sidewall oxide to reduce the thickness thereof and provide a predetermined thickness of insulation between the NMOS gate and the associated source and drain regions; (6) removing the NMOS overhang mask; (7) selectively implanting n-type ions in the NMOS active area using a relatively low energy and dose to form shallow lightly doped LDD regions in self-alignment with the NMOS gate between the gate and the n+ NMOS source and drain regions; (8) removing the mask from the PMOS device active area; (9) masking the NMOS device active area; (10) implanting the PMOS source and drain regions to a relatively heavy p+ doping concentration in self-alignment with the PMOS overhang maks; (11) selectively etching the PMOS sidewall oxide to reduce the thickness thereof and thereby provide a predetermined thickness of insulation between the PMOS gate and the associated source and drain regions; (12) removing the PMOS overhang mask: (13) selectively implanting n-type species using a relatively low energy and dose to thereby form n-type guard band regions about associated PMOS LDD regions in self-alignment with the PMOS gate and between the gate and the p+ PMOS source and drain regions; and (14) blanket implanting the structure with p-type species using a relatively low energy and dose to simultaneously form a guard band regions about the NMOS LDD regions and the LDD regions in the PMOS LDD structures.

* * * * *

UNITED STATES PATENT AND TRADEMARK OFFICE
CERTIFICATE OF CORRECTION

PATENT NO. : 4,703,551
DATED : November 3, 1987
INVENTOR(S) : Nicholas J. Szluk et al.

It is certified that error appears in the above—identified patent and that said Letters Patent is hereby corrected as shown below:

Column 11, line 8, after the word "n-type" insert --ion--.

Column 11, line 11, "ot" should be --to--.

Column 11, line 14, "from a" should be --form--.

Column 11, line 25, "region" should be --regions--.

Column 11, line 31, "sourve" should be --source--.

Column 11, line 35, after the word "form" delete --a--.

Column 11, line 41, "doe" should be --dose--.

Column 11, line 42, "accociate" should be --associated--.

Column 11, line 46, "sturcture" should be --structure--.

Column 11, line 63, "oped" should be --doped--.

Column 12, line 1, "structure" should be --structures--.

Column 12, line 2, "lighly" should be --highly--.

Column 12, line 6, "region" should be --regions--.

Column 12, line 14, "incorporting" should be --incorporating--.

Column 12, line 22, "structure" should be --structures--.

Column 12, line 53, "ture" should be --tures--.

UNITED STATES PATENT AND TRADEMARK OFFICE
CERTIFICATE OF CORRECTION

PATENT NO. : 4,703,551

DATED : November 3, 1987

INVENTOR(S) : Nicholas J. Szluk et al

It is certified that error appears in the above-identified patent and that said Letters Patent is hereby corrected as shown below:

Column 13, line 14, "maks" should be -- mask --.

Signed and Sealed this

Fifth Day of July, 1988

*Attest:*

DONALD J. QUIGG

*Attesting Officer*   *Commissioner of Patents and Trademarks*